US007692410B2

(12) United States Patent
Coleman et al.

(10) Patent No.: US 7,692,410 B2
(45) Date of Patent: Apr. 6, 2010

(54) METHOD AND DEVICE FOR DETERMINING CHARACTERISTICS OF AN UNKNOWN BATTERY

(75) Inventors: Martin Coleman, Galway (IE); Chi Kwan Lee, Galway (IE); William Gerard Hurley, Galway (IE); Chunbo Zhu, Harbin (CN)

(73) Assignee: National University of Ireland, Galway (IE)

( * ) Notice: Subject to any disclaimer, the term of this patent is extended or adjusted under 35 U.S.C. 154(b) by 430 days.

(21) Appl. No.: 11/717,702

(22) Filed: Mar. 14, 2007

(65) Prior Publication Data
US 2007/0216367 A1 Sep. 20, 2007

(30) Foreign Application Priority Data
Mar. 14, 2006 (EP) ................... 06075610

(51) Int. Cl.
*H02J 7/00* (2006.01)
*H02J 7/06* (2006.01)
*G01N 27/416* (2006.01)
(52) U.S. Cl. ............ 320/160; 320/139; 320/162; 320/163; 320/164; 324/432
(58) Field of Classification Search ............ 320/139, 320/141, 145, 160
See application file for complete search history.

(56) References Cited
U.S. PATENT DOCUMENTS

| 6,281,683 | B1 * | 8/2001 | Podrazhansky et al. ..... 324/432 |
| 2001/0009371 | A1 | 7/2001 | Podrazhansky et al. |
| 2002/0030495 | A1 | 3/2002 | Kechmire |

FOREIGN PATENT DOCUMENTS

WO    WO 97/03489 A1    1/1997

OTHER PUBLICATIONS

European Search Report dated Sep. 5, 2006 (Eight (8) pages).

* cited by examiner

*Primary Examiner*—Edward Tso
*Assistant Examiner*—Yalkew Fantu
(74) *Attorney, Agent, or Firm*—Crowell & Moring LLP

(57) ABSTRACT

An apparatus for determining a rate of charge/discharge, C rate, or state of charge, SOC, of a battery having unknown characteristics comprises a circuit for applying at least a two-pulse current load to said battery. A change in voltage, $\Delta V$, resulting from the application of the second or a subsequent pulse is used to determine the C rate of the battery as a function of $\Delta V$. An Open Circuit Voltage, OCV, of the battery a time interval after the completion of the application of the second or subsequent pulse is used to determine the SOC of the battery as a function of OCV.

10 Claims, 5 Drawing Sheets

METHOD AND DEVICE FOR DETERMINING CHARACTERISTICS OF AN UNKNOWN BATTERY

This Application claims priority from European patent application Ser. No. 06075610.3, filed Mar. 14, 2006, the entire contents of which are expressly incorporated herein by reference.

The present invention relates to a method and device for determining characteristics of an unknown battery and in particular, an unknown battery's maximum capacity, remaining capacity and/or state of charge (SOC).

Battery capacity is the amount of power a battery can deliver and is measured in Ampere hours (Ah) when discharged over a given period of time. Thus a battery's maximum capacity is the maximum amount of power the battery can deliver when fully charged, referred to as "battery size" and a battery's remaining capacity is the amount of power the battery can deliver at a given state of discharge. In the present specification, this is provided as a battery's State Of Charge (SOC)

The rate of charge or discharge of a battery is called the C rate and is calculated as current load divided by rated capacity. For example, a battery having 20 Ah rated capacity powering a 10 A load will have a C rate of 0.5. If a battery is discharged at a higher C rate, the battery capacity is reduced considerably.

Knowledge of maximum available capacity, remaining capacity and SOC of an unknown battery is particularly important in Battery Management Systems (BMS). BMS are often used in emergency back-up systems or automotives where a failing battery is replaced with one having a different rated Ah capacity. BMS require such battery information in order to set appropriate charging regimes and current charges. This information further enables the BMS to determine whether the remaining capacity is capable of delivering a required amount of power for a system.

Furthermore, such battery information is also useful for stand-alone battery testing devices.

It is an object of the present invention to provide a method and system for determining characteristics of an unknown battery such as maximum capacity, remaining capacity and/or state of charge (SOC).

According to a first aspect of the present invention, there is provided a method of determining a rate of charge/discharge, C rate, of a battery having unknown characteristics as claimed in claim 1.

These objects and other objects and advantages of the present invention will become more apparent upon reading of the following detailed description and the accompanying drawings in which:

DETAILED DESCRIPTION OF THE ART

An application of a current pulse to a battery results in a voltage change, $\Delta V$, across the battery.

Figure 1:
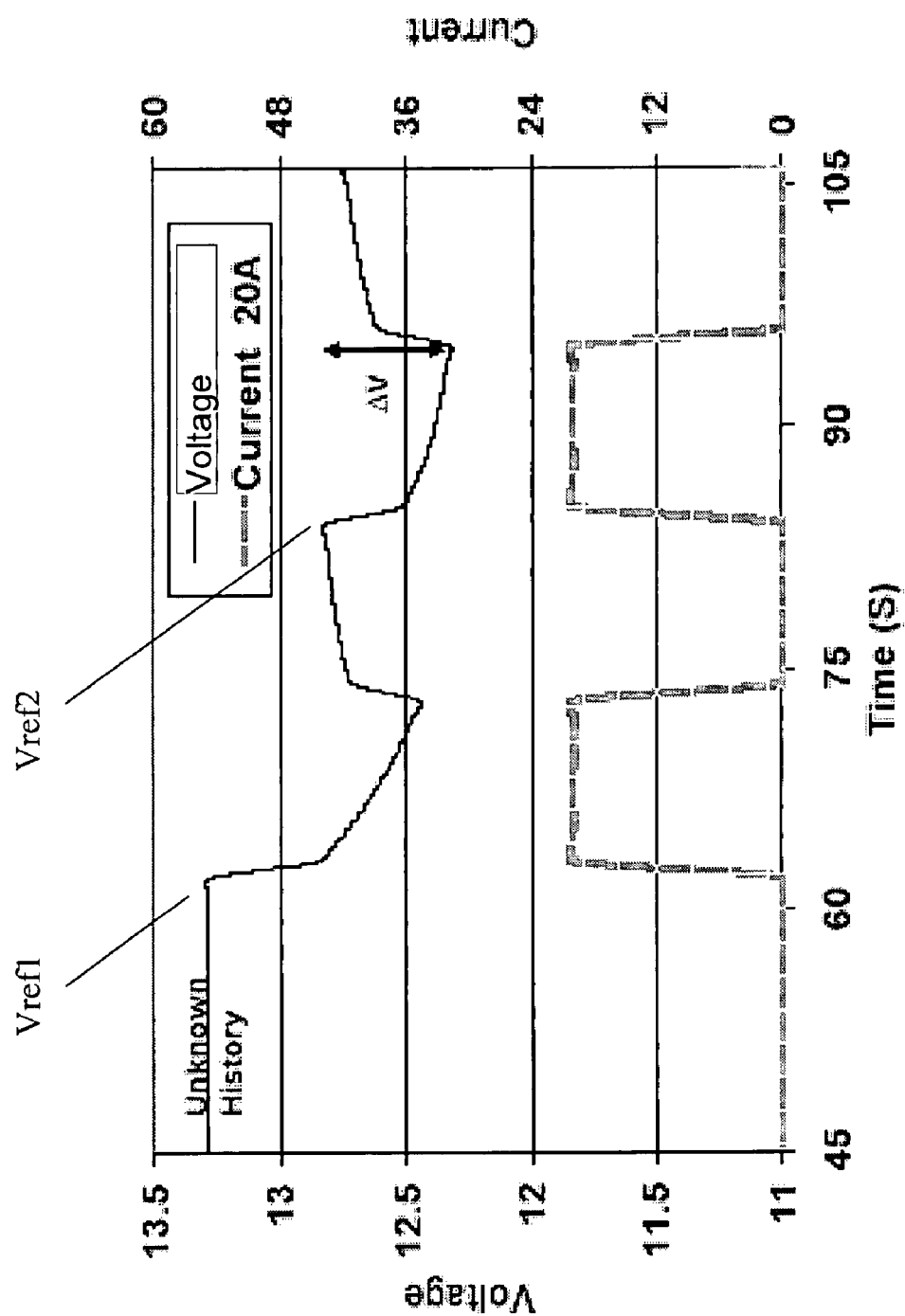
FIG. 1 is a graphical representation of voltage and current against time for a battery having unknown characteristics to which a 20 Amp two-pulse load has been applied.

In the preferred embodiment of the present invention, a two-pulse current load of 20 Amps is applied to a battery having unknown characteristics, as is illustrated in FIG. 1, and a resulting voltage change, $\Delta V$, is measured. In the embodiment, $\Delta V$ is taken as the maximum change in battery voltage under the pulsed load. It will be seen that $\Delta V$ could also be taken as the difference in battery voltage immediately before and after the pulse. However, this would produce a smaller range of values and so less accurate results.

The current load pulse has an on-time of 10 secs, and an off-time of 10 secs. However it will be appreciated that the current load pulse may have any suitable on-times and off-times.

Furthermore, it will be appreciated that a multi-pulse current load may be applied to the battery, and voltage change $\Delta V$ resulting from any subsequent pulse may be measured. Nonetheless, it will be seen that excessive pulsing of the battery may unduly drain the battery power for testing purposes.

In the embodiment, the first pulse is applied to obtain a reference point, Vref2 from which the $\Delta V$ resulting from the application of the second pulse may be measured.

A $\Delta V$ relative to Vref1 caused by application of the first pulse is an unreliable measurement, as the history of the battery is unknown and thus the reference point, Vref1, from which the $\Delta V$ would be calculated may be an inaccurate representation of the battery's characteristics incorporating variations such as a 'coupe de fouet', kinetic or diffusion effects due to recent charging or discharging.

Figure 2:
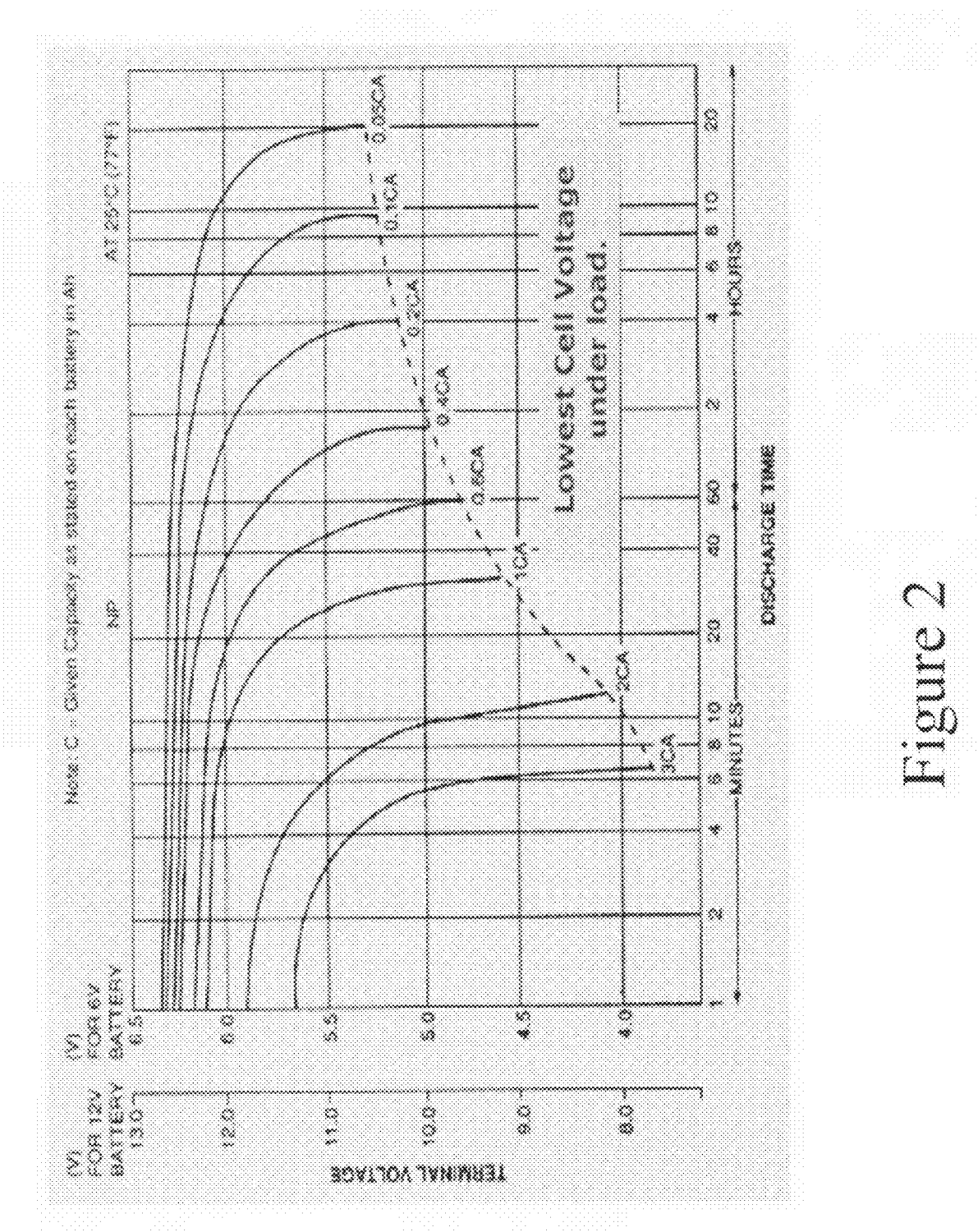
FIG. 2 is a graphical representation of characteristics of a 12V battery and a 6V battery with different C rates.

The change in SOC of a battery is dependent on the C rate. Referring to FIG. 2, characteristics of a 12V battery and a 6V battery under different C rates are graphically represented. As illustrated, the smaller the C rate, the higher the cut-off voltage for the lowest acceptable cell voltage. From the definition of C rate, it is known that the current load is proportional to the C rate. Thus, the value of current load chosen for testing purposes is important as too large a current load applied to a battery causes a deep discharge or cranking and too small a current load is insufficient for accurate determination of the battery characteristics. Thus, it may be deduced that during testing, for batteries having a larger capacity, a larger current load, and therefore a larger $\Delta V$ is preferable and vice versa.

In the preferred embodiment, a current load of 20 Amps is chosen as the testing standard as it produces accurate results for batteries having maximum capacities in the range of approximately 15 Ah to 120 Ah. However, it will be appreciated that the testing standard may be replaced by any value of current load, for example, 5 Amps or 30 Amps.

In the preferred embodiment, the value of $\Delta V$ measured is compared with a benchmark range, comprising upper and lower threshold values. If the $\Delta V$ measured is below the lower threshold, the current load applied to the battery under test is increased and $\Delta V$ is measured again. Similarly, if the $\Delta V$ measured is above the upper threshold, the current load applied to the battery under test is decreased and $\Delta V$ is measured again.

Figure 3:
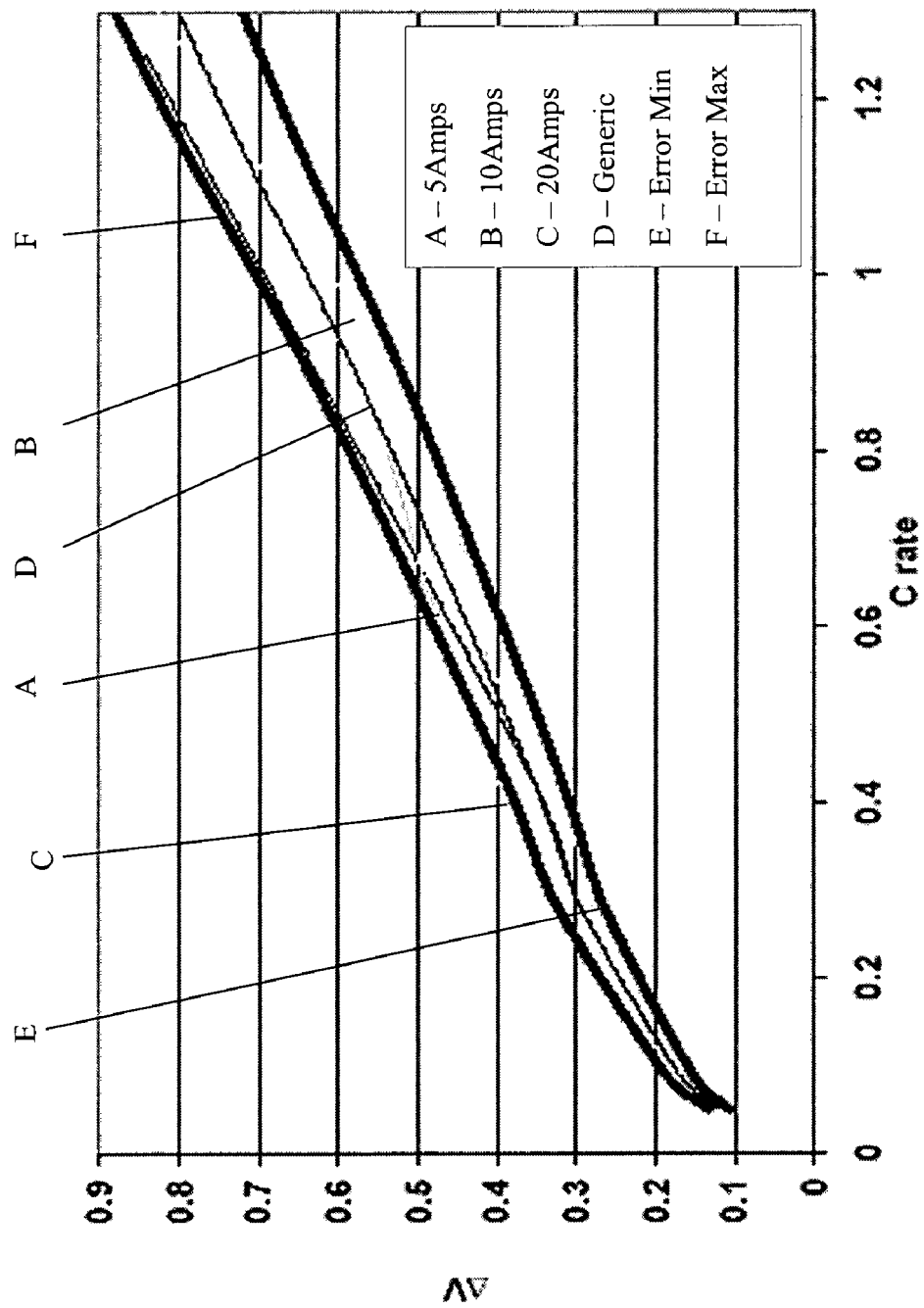
FIG. 3 is a graphical representation of $\Delta V$ against C rate for various battery sizes to which various different current pulse loads were applied.

FIG. 3 is a graphical representation of $\Delta V$ against C rate for various battery sizes to which various different current pulse loads were applied. From this representation, it can be seen that 5, 10 and 20 Amp current loads produce curves within a 10% error factor of a generic curve D. As such, using a measured $\Delta V$ and the generic curve D, a C rate for the unknown battery in question can be determined.

In the preferred embodiment, a further check is carried out to determine whether the C rate falls within a benchmark range. Preferably, the benchmark range is approximately 0.05 to 1.2.

Using the C rate and the current load, the maximum capacity can be calculated, as the maximum capacity is defined as the current load divided by the C rate:

$$C_{rate} = \frac{I}{Ah}$$

As an alternative to using an absolute value of load current, a value of load current resulting from a change in current load can be used with the change in the C rate to determine the maximum capacity, as defined below:

$$\Delta C_{rate} = \frac{I_2 - I_1}{Ah}$$

According to a further aspect of the present invention, there is provided a method for determining an unknown battery's State Of Charge, SOC.

A battery's SOC is proportional to the equilibrium voltage of the battery or the open circuit voltage (OCV) of the battery when the battery is in open circuit over a long period of time.

Electromotive Force Voltage (EMF) indicates the OCV in equilibrium and is defined as $$EMF = (\theta * A\theta, T + EMF\ min)\beta,$$

where θ is SOC, Aθ, T is slope of EMF voltage change with SOC and temperature, EMF min is EMF voltage at zero SOC and β is a weighting coefficient.

In the preferred embodiment, a two-pulse current load is applied to a battery with unknown characteristics. As explained with respect to the first aspect of the invention, the first pulse is applied to obtain a reference point, Vref2, unaffected by previous history of the battery. Again, preferably, the current pulse is applied for 10 secs on, 10 secs off.

Once the second pulse current load is removed, the OCV is measured. Preferably, the OCV is measured after a time interval of approximately 10 secs. This time interval is generally sufficient to enable a battery to reach 90% of its equilibrium voltage.

Figure 4:
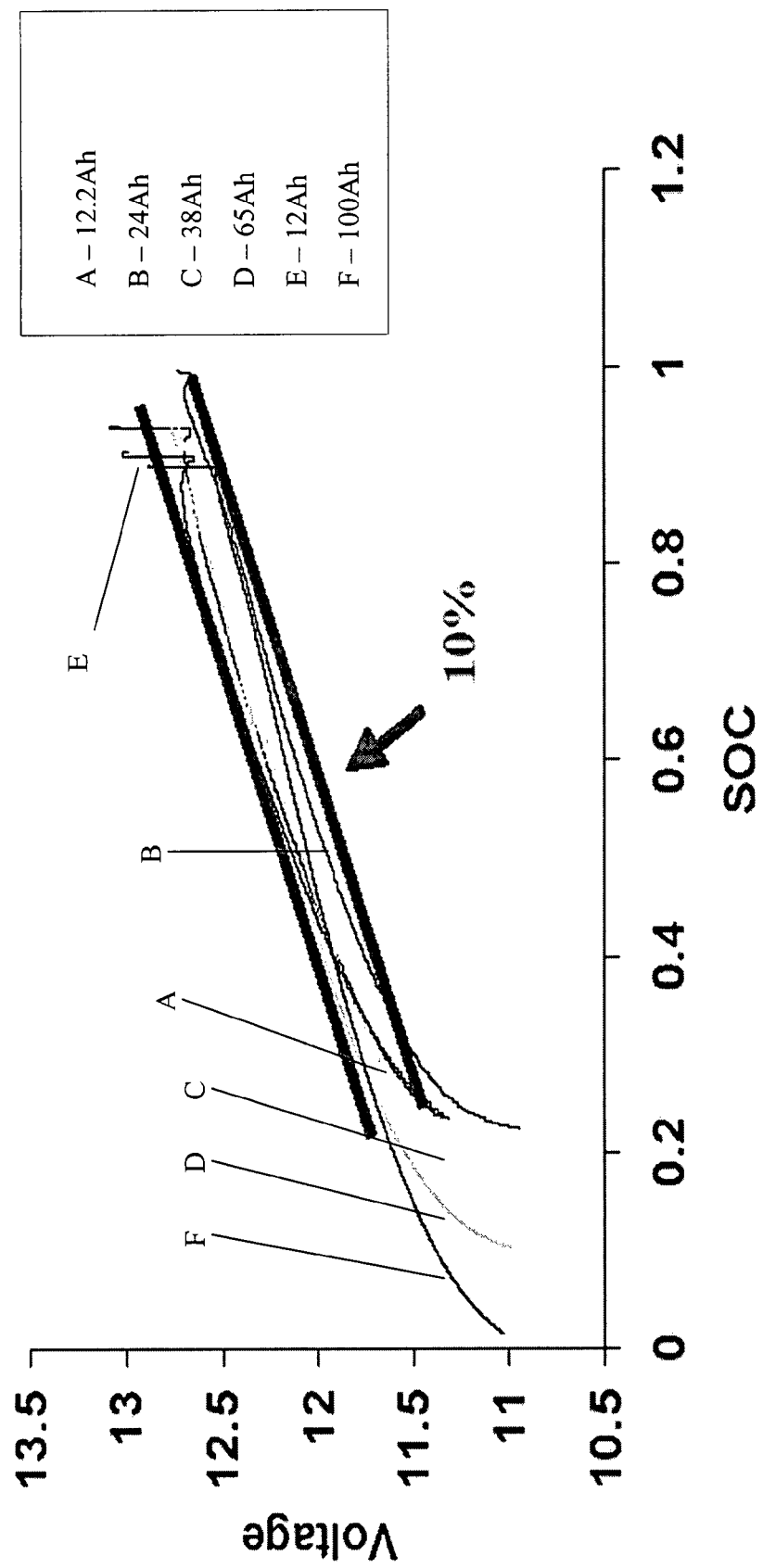
FIG. 4 is a graphical representation of OCV against SOC for a variety of different battery sizes to which the same current load has been applied.

Referring now to FIG. 4, there is illustrated a graphical representation of OCV against SOC for a variety of different battery sizes to which the same current load has been applied. Using such graphical representations and the measured OCV of a given battery, a SOC range for the battery may be determined.

Despite the fact that the various different battery sizes of FIG. 4 were examined under the same current load and therefore, have different C rates, the OCV recovery of each of the battery sizes is similar in the linear phase of the discharge, which in this case is above 40% SOC. In this region, the curves are within approximately a 10% range. However, below 35% SOC, the C rate curves diverge. This is due to deep discharge of the VRLA batteries, which causes sulphation of the battery plates, reducing the active surface area and the capacity of the cells.

As such, it will be appreciated however that, batteries having a SOC greater than 40% will produce the most accurate results.

The remaining capacity of a battery is determined from knowledge of the maximum capacity of a battery and the SOC of the battery. For example, if a 24 Ah battery has a SOC of approximately 45%, the remaining capacity is calculated as 45%*24=10.8 Ah.

Figure 5:
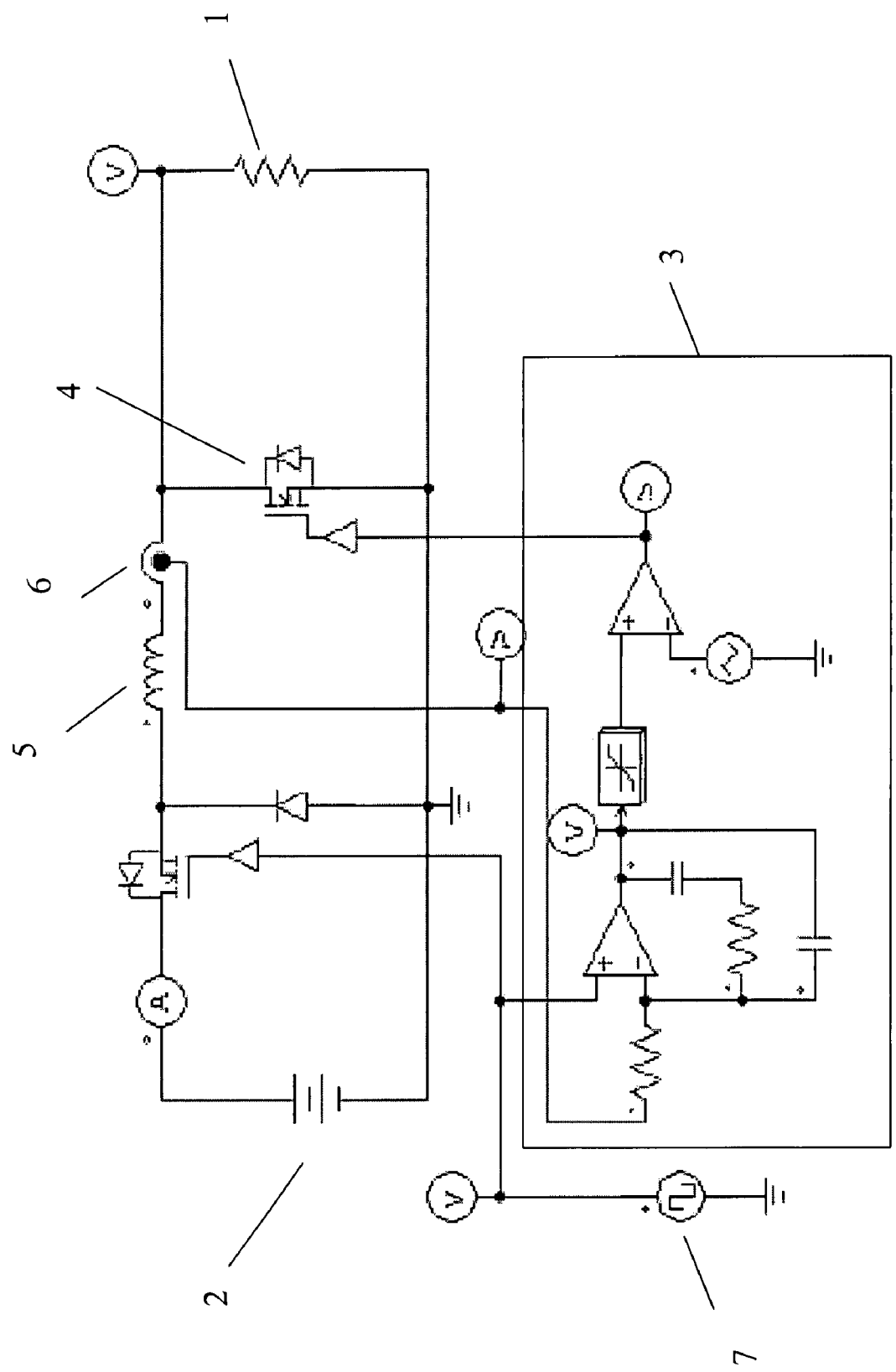
FIG. 5 is a circuit schematic of a load circuit according to the preferred embodiment of the present invention.

Referring now to FIG. 5, there is illustrated a circuit schematic of a load circuit according to the preferred embodiment of the present invention.

A 50Ω resistor, 1, is used to apply a load of 20 A across a battery, 2. The 20 A load is set by a boost circuit, 3. As the current reaches 20 A, a switch, 4, is turned off and an inductor, 5, releases the current into the circuit. When the current drops below 20 A, a current sense, 6, turns on the switch again. A functional generator, 7, controls the circuit at 100 Hz at 1 Vpk-pk, the duty cycle is 75% and the Vdc offset is 25 mVmdc.

The present invention is not limited to the embodiments described herein, which may be amended or modified without departing from the scope of the present invention.

The invention claimed is:

1. A method of determining a rate of charge/discharge, C rate, of a battery having unknown characteristics comprising:
   applying at least a two-pulse current load to said battery;
   measuring a change in voltage, ΔV, only resulting from the application of one of the second or a subsequent pulse, wherein said change in voltage is substantially equal to the difference between an open circuit voltage of the battery prior to the application of the second or subsequent pulse and a loaded circuit voltage resulting from the application of the second or subsequent pulse; and
   determining the C rate of the battery as a function of ΔV.

2. The method of claim 1 wherein said determining step comprises determining the C rate from a look-up table of values of ΔV.

3. The method of claim 1 wherein said determining step comprises determining the C rate as a mathematical function of ΔV.

4. The method of claim 1 further comprising determining a maximum capacity of the battery by dividing the applied current load by the determined C rate.

5. The method of claim 4 wherein the applied current load is a change in current from a first load current to a second load current and wherein said determining comprises determining a change in C rate as a function of said change in voltage.

6. The method of claim 1 further comprising:
   comparing ΔV with a benchmark; and
   changing the value of the applied current load if ΔV does not comply with the benchmark.

7. The method of claim 6 wherein said benchmark comprises an upper limit and a lower limit.

8. The method of claim 7, comprising:
   responsive to ΔV being greater than the upper limit, decreasing the current load, and
   responsive to ΔV being lower than the lower limit, increasing the current load.

9. The method of claim 1 comprising applying said current load pulse for an on-time of 10 secs and an off-time of 10 secs.

10. An apparatus for determining a rate of charge/discharge, C rate, of a battery having unknown characteristics comprising:
    a circuit for applying at least a two-pulse current load to said battery;
    a sensor for measuring a change in voltage, ΔV, only resulting from the application of one of the second or a subsequent pulse, wherein said change in voltage is substantially equal to the difference between an open circuit voltage of the battery prior to the application of the second or subsequent pulse and a loaded circuit voltage resulting from the application of the second or subsequent pulse; and
    means for determining the C rate of the battery as a function of ΔV.

* * * * *